(12) United States Patent  (10) Patent No.: US 8,652,310 B2
McLeod  (45) Date of Patent: Feb. 18, 2014

(54) TRIM MAGNETS TO ADJUST EROSION RATE OF CYLINDRICAL SPUTTER TARGETS

(75) Inventor: Paul Stephen McLeod, Berkeley, CA (US)

(73) Assignee: Seagate Technology LLC, Cupertino, CA (US)

( * ) Notice: Subject to any disclaimer, the term of this patent is extended or adjusted under 35 U.S.C. 154(b) by 759 days.

(21) Appl. No.: 12/179,094

(22) Filed: Jul. 24, 2008

(65) Prior Publication Data

US 2010/0018854 A1  Jan. 28, 2010

(51) Int. Cl.
*C23C 14/34* (2006.01)

(52) U.S. Cl.
USPC ............. 204/298.21; 204/192.12; 204/298.22

(58) Field of Classification Search
USPC ...................... 204/192.12, 298.21, 298.22
See application file for complete search history.

(56) References Cited

U.S. PATENT DOCUMENTS

| | | | | |
|---|---|---|---|---|
| 3,956,093 A | * | 5/1976 | McLeod | 204/192.12 |
| 4,407,713 A | * | 10/1983 | Zega | 204/298.22 |
| 5,047,131 A | * | 9/1991 | Wolfe et al. | 204/192.23 |
| 5,106,474 A | * | 4/1992 | Dickey et al. | 204/298.14 |
| 5,593,551 A | * | 1/1997 | Lai | 204/192.12 |
| 5,865,970 A | * | 2/1999 | Stelter | 204/298.19 |

FOREIGN PATENT DOCUMENTS

JP  2006037127 A  *  2/2006

* cited by examiner

*Primary Examiner* — Keith Hendricks
*Assistant Examiner* — Jason M Berman
(74) *Attorney, Agent, or Firm* — Mitchell K. McCarthy; McCarthy Law Group

(57) ABSTRACT

A cylindrical magnetron sputtering apparatus includes a rotating cylindrical sputtering target, a non-rotating magnet structure within the cylindrical sputtering target and at least one non-rotating trim magnet adjacent an end of the magnet structure. The trim magnets are manipulated during operation of the apparatus to alter a magnetic field produced by the magnet structure within the cylindrical sputtering cathode. As a result the shape of a racetrack discharge plasma formed at an end of the sputtering target is altered such that the formation of an erosion groove is avoided.

20 Claims, 5 Drawing Sheets

TRIM MAGNETS TO ADJUST EROSION RATE OF CYLINDRICAL SPUTTER TARGETS

BACKGROUND OF THE INVENTION

One key component of any computer system is a device to store data. Computer systems have many different places where data can be stored. One common place for storing massive amounts of data in a computer system is on a disc drive. The most basic parts of a disc drive are an information storage disc that is rotated, an actuator that moves a transducer to various locations over the disc, and electrical circuitry that is used to write and read data to and from the disc. The disc drive also includes circuitry for encoding data so that it can be successfully retrieved and written to the disc surface. A microprocessor controls most of the operations of the disc drive as well as passing the data back to the requesting computer and taking data from a requesting computer for storing to the disc.

In the disc drive industry, high-performance, thin-film storage discs produced by depositing successive layers on a substrate apparatus for preparation of such storage discs are well known in the art. For storage discs of the type formed on a rigid disc substrate, each layer in the storage disc may be deposited in a separate chamber. For example, the underlayer, the magnetic layer, and the over-layer (lubrication layer) are generally deposited in separate processing chambers. Generally, such layers are deposited onto the disc surfaces using sputtering processes.

Sputtering is a well known method of providing relatively uniform deposits of material on a substrate. Essentially, sputtering is accomplished by the impingement of gas ions on a cathode plate or target plate in the presence of an electrostatic field which causes particles of the cathode plate material to be dislodged therefrom. By appropriately positioning a substrate in the path of such dislodged particles, a deposit of cathodic material will be produced on the substrate. In a typical sputtering system the target (cathode) and substrate holder (anode) are positioned so that the surface of the substrate upon which the film is to be deposited is placed on the holder, facing the target.

SUMMARY OF THE INVENTION

This invention relates to a cylindrical magnetron sputtering apparatus comprising a rotating cylindrical sputtering target; a non-rotating structure comprising a magnet, the non-rotating structure being within the rotating cylindrical sputtering target; and at least one trim magnet in the vicinity of the non-rotating structure and operable to alter the shape of a racetrack-shaped discharge plasma formed at an end of the rotating cylindrical sputtering target, wherein the trim magnet is moveable and non-rotating.

These and various other features and advantages will be apparent from a reading of the following detailed description.

BRIEF DESCRIPTION OF THE DRAWINGS

The present invention will be better understood by reference to the Detailed Description of the Invention when taken together with the attached drawings, wherein.

DETAILED DESCRIPTION OF THE INVENTION

Figure 1:
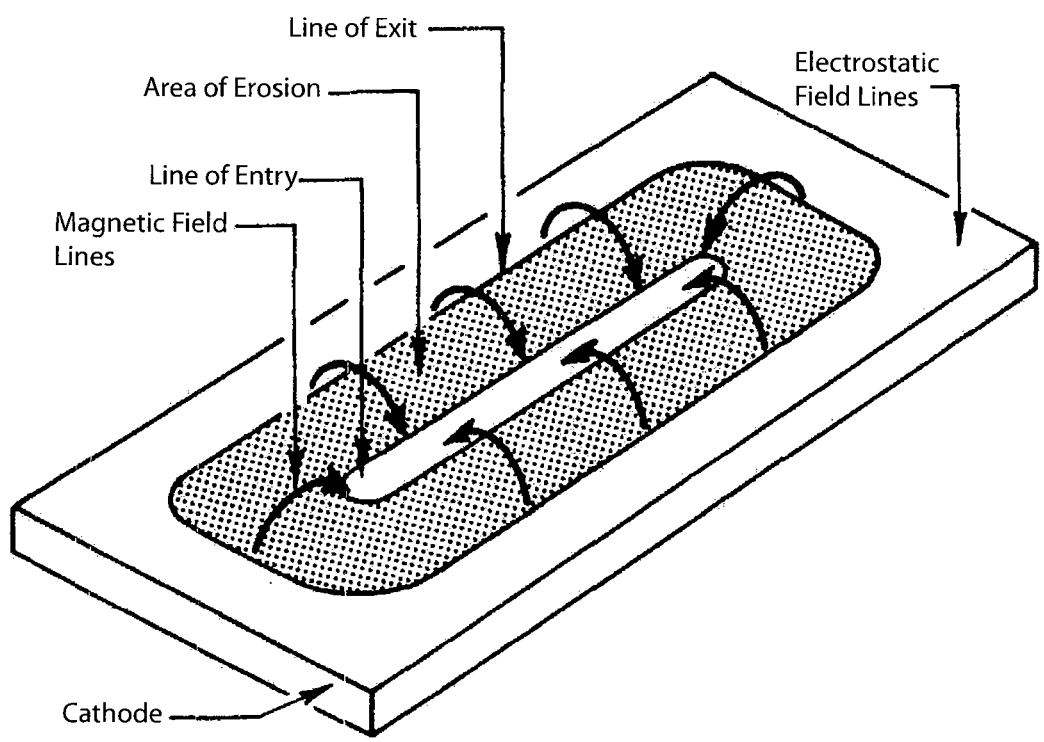
FIG. 1 shows a planar magnetron sputter target.

The present invention relates to the field of mass storage devices. More particularly, this invention relates to sputter deposition of films on storage discs using magnetron sputtering with cylindrical targets.

The invention is directed to an apparatus and method for controlling the erosion rate at the ends of the cylindrical target. With use of the invention the formation of bands of increased erosion toward the ends of the cylindrical target may be avoided. Furthermore, the invention also provides a method and apparatus for reducing backscattered sputtering material on the non-eroded ends of the cylindrical target.

One embodiment of this invention relates to a cylindrical magnetron sputtering apparatus. The invention includes a rotating cylindrical cathode and a non-rotating magnet structure provided within the cylindrical cathode. Non-rotating trim magnets are located at either end of the cylindrical cathode and are operable to alter the shape of the racetrack discharge plasma formed on the ends of the cylindrical target. The trim magnets are movable so as to manipulate the fields of an end magnet of the array inside the cathode. By doing so, the location of the racetrack "turnaround" erosion groove can be manipulated to be varied to prevent excessive erosion at the target ends.

In another embodiment of the invention, the trim magnets are electromagnets with a variable magnetic field strength. In this embodiment the trim magnets are operable to manipulate the magnetic field of the end magnet by varying the strength of their own magnetic field.

Another embodiment of the invention relates to a method of sputtering. The method includes steps of providing a magnet structure with end magnets and rotating a cylindrical target around the magnet structure. A substrate is positioned on the outside of the cylindrical target, opposite the magnet structure. The cylindrical target and the substrate are energized with an electrical potential, thereby forming a discharge plasma adjacent the cylindrical target. Trim magnets are positioned adjacent the magnet structure at each of its ends. In order to change the location of the racetrack erosion groove the trim magnets are manipulated to alter the magnetic field of the end magnets and thereby alter the shape of the discharge plasma.

Increased sputtering rates are achieved by confining electrons of the glow discharge plasma, in which the gas ions are produced, in close proximity to the target plate, such that ionization of the gas will occur more frequently. In this manner, an increased rate of ion impingement upon a target plate, and hence greater sputtering activity, is enabled. More specifically, a magnetic field is provided such that flux lines extend from and return in an arched or curved path to the surface of a target plate thereby forming a virtual "tunnel". By providing the aforementioned magnetic field in a closed loop or "racetrack" configuration, electrons will tend to be swept about this loop under the influence of the applied magnetic field and electric field. It is the resulting plasma confinement which promotes a high degree of ionization of molecules of the ambient gas, e.g. argon. The ions are electrostatically attracted to the target plate and thus effectively stimulate a high degree of sputtering activity and correspondingly high deposition rates of cathodic, or sputtered, material on a substrate.

Material sputtered from a target plate subjected to the aforedescribed magnetic field is dislodged primarily from an erosion region underlying the curved flux lines. In addition, the region that exists at which such flux lines are parallel to the cathode traps the electrons most efficiently. This, in turn results in maximum target erosion at a region substantially aligned with and underlying the foregoing area over which magnetic flux lines are parallel to the target plate. When a complete target plate area is considered, it has been found that a line defining the nadir of a deep "valley" exists in the cathode plate approximately centrally of the aforementioned closed magnetic loop. Accordingly, erosion of the cathode or target occurs along the "racetrack," leaving the center and the edges of the target intact on the cathode, rather than being deposited on the substrate. This is disadvantageous, as usually only approximately a third of the target material can be utilized for deposition on the substrate. A planar cathode with an area of erosion in the form of a racetrack configuration is shown in FIG. 1.

Systems such as that described above, wherein the target is a plate material are called planar magnetron sputtering systems. In addition to the low target utilization, planar magnetron targets also have other limitations. While portions of the targets are not sputtered, they are collecting sputtered atoms from the sputtered areas that are backscattered from collisions with the sputtering gas. Over time, the films that collect on the non-sputtered areas build up and also react with ambient gases other than the inert sputter gas that are always present in an imperfect vacuum. Since the ambient gases are preferably reactive; e.g. $H_2O$, $N_2$, $O_2$ $CO_2$, the deposits tend to be insulative and therefore collect charges from the discharge. When the charge is sufficient, arcing occurs; either to the chamber walls or through the insulative films to the target. Arcing causes local heating and vaporization; i.e. small explosions which often eject particles onto the substrate thereby causing defects in the coatings being deposited. Even if no arcing occurs the films that build up are often highly stressed and tend to exfoliate also causing film defects.

In addition to the planar sputtering process, cylindrical cathodes have been utilized. In this process, cylindrical targets are rotated in front of magnet arrays that are very similar to the planar cathode magnet arrays (see U.S. Pat. No. 3,956,093, which is incorporated herein by reference). In this configuration almost all of the cylindrical targets are rotated in front of the magnets and all but a small band at the top and the bottom of the targets is eroded, In this invention alloys such as CoCrPtB for pass-by metal sputtering are used. Cr, Pt, and B are added to Co to control the crystal lattice size and orientation and the grain size. Pass-by sputtering is used to coat large substrate areas uniformly and quickly. By moving the substrate past the sputter target, the film uniformity in the direction of travel can be very uniform if the sputter rate is held constant. If the target is long enough to span the other axis of the substrate, the coating over the substrate will be uniform. Further since the substrate can be continuously moved past the target, large areas can be rapidly coated. In one example many discs are robot-loaded into holes of a vertical plate and transported past magnetron sputter sources, which coat both sides of the disc simultaneously.

Generally, cylindrical cathodes are useful for coating substrates of complex shapes. Because, the cylindrical cathodes have a relatively uniform wall erosion rate and the object to be coated has an unobstructed view of the cathode surface. The concept of rotating cylindrical cathodes is generally known.

In such a device, a cathode target assembly in the form of an elongated, cylindrical tube carries a layer of material applied to its outer surface that is to be sputtered. The target tube is rotated about its longitudinal axis.

Figure 2:
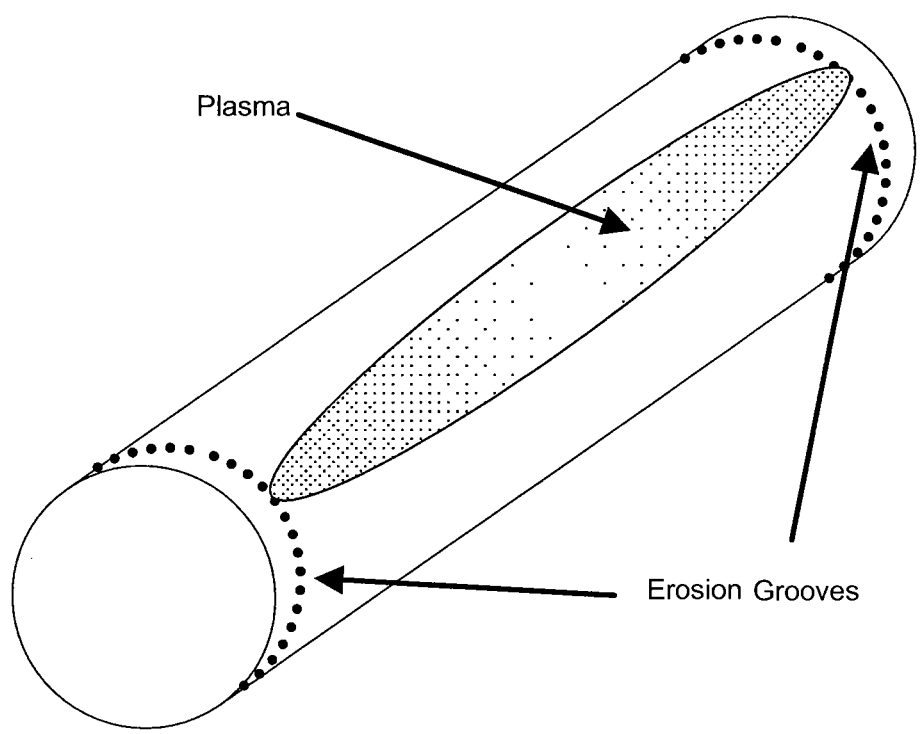
FIG. 2 shows a cylindrical magnetron sputter target.

Rotating cylindrical cathodes are not subject to a deep ring-shaped area of erosion along the racetrack configuration of the magnetic field of the magnetron because the cathodes, or targets, are not stationary and the area in which erosion occurs is constantly changing. Nonetheless, the targets could be subject to a small non-uniform erosion resulting from the racetrack configuration of the magnetic field at the top and bottom of the targets, as shown in FIG. 2.

First, the targets are subject to slightly more erosion towards its ends where it is subjected to the return path of the magnetic fields. At the ends of the "racetrack" the increased width of the magnetic field resulting from the return path causes more of the target to be eroded. Consequently, the erosion rate of cylindrical targets is slightly higher toward each end of the target and eroded bands are formed around the circumference of the target.

Second, the very ends of the target, which are preferably beyond the ends of the magnetic field lines, do not erode. As a result the non-eroded ends may collect a buildup of back-scattered sputtered material. This material has the potential of arcing and/or flaking off the target and can lead to defects in the sputtered film on the substrates.

Figure 3:
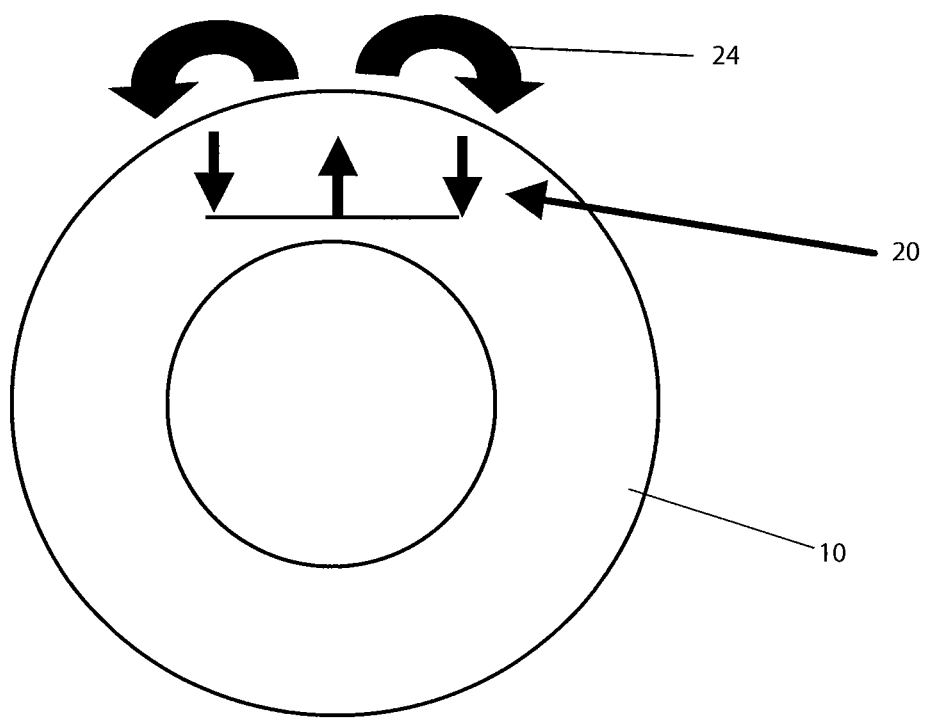
FIG. 3 shows a cross-sectional view of a cylindrical magnetron sputter target in accordance with the invention.

One embodiment of the invention includes the cylindrical magnetron sputter cathode 10 depicted in FIG. 3. A cylindrical cathode or target 10 is positioned around a magnet structure 20. The target 10 acts as a sputtering source for a material to be sputtered onto a substrate. Possible materials for sputtering onto the substrate include but are not limited to carbon, copper, titanium Co, Cr, Ta, Pt, Ru, Mo, multiple alloys of these elements or similar alloys containing compounds such as $TiO.sub.2$ or $SiO.sub.2$ which can affect grain boundary separation. The target 10 is in the form of an elongated cylinder and preferably has a length that is greater than its diameter, such that the target is in the form of an elongated tube. The magnet structure 20 is placed within the cylindrical target 10 close to one side thereof. A magnetic field formed by the magnet structure produces flux lines 24 which follow an arched path extending away from and then toward the cylindrical target, as shown in FIG. 3. The magnetic field produced by the magnet structure 20 is in the form of a closed loop or annular form, similar to that shown in FIGS. 1 and 2.

Figure 5:
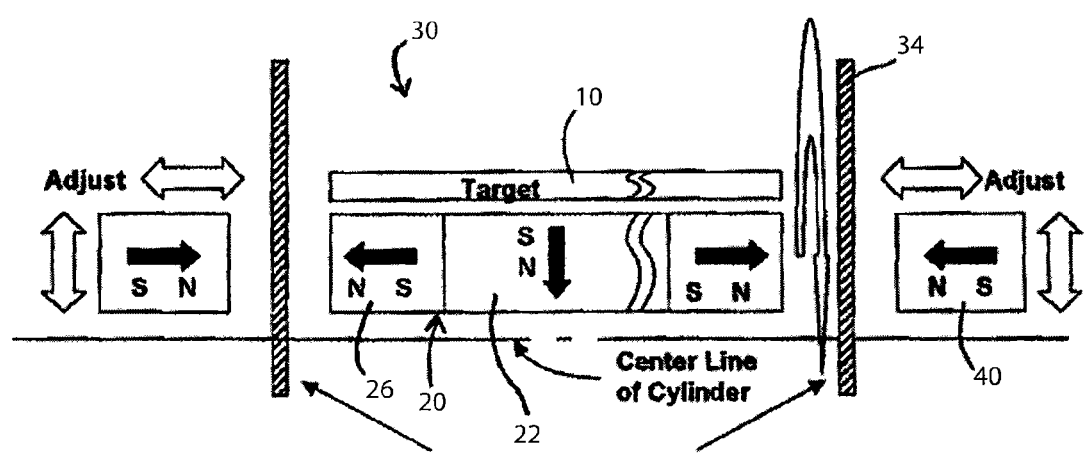
FIG. 5 shows a cross-sectional view of another embodiment of a cylindrical magnetron sputter target in accordance with the invention.

The magnet structure 20 is formed of an array of magnets. The structure preferably has an elongated shape corresponding to the shape of the cylindrical cathode 10. In one embodiment, the magnet structure 20 is comprised of a plurality of U-shaped permanent magnets which form the arching flux lines formed adjacent to the target 10. At the end of the magnetic structure the direction of the flux lines is altered by end magnets 26 (FIG. 5). The main magnet or array of magnets 22 (FIG. 5) yield flux lines 24 which loop along a plane that is perpendicular to the axis of the target. However, end magnets 26 produce field lines that are perpendicular to those formed by the main array of magnets 22. The combination of the main magnet 22 and the end magnets 26 is the closed-loop magnetic field adjacent the cylindrical cathode 10. The ends of the closed-loop magnetic field corresponds to the ends of the cylindrical cathode. Similar to the main magnet 22, the end magnets may also be formed of an array of individual magnets. However, the overall polarization of the magnetic field produced by the end magnets 26 is perpendicular to that of the main magnet(s) 22. Although the figures and description indicate that the magnet structure is formed of permanent magnets, it should be recognized that suitable electromagnets may be used in place of the permanent magnets to form the closed-loop magnetic field. Likewise, although the preferred form of the invention includes an elongated magnet structure it should be understood to one of ordinary skill that the magnet structure 20 may be not be elongated and, for example may be circular or square forming a magnetic field with a likewise shape. In such an instance, the "ends" of the magnet structure and resultant magnetic field described in the following may be understood as those sections of the structure or field which are closest to the ends of the cylindrical target 10.

Figure 4:
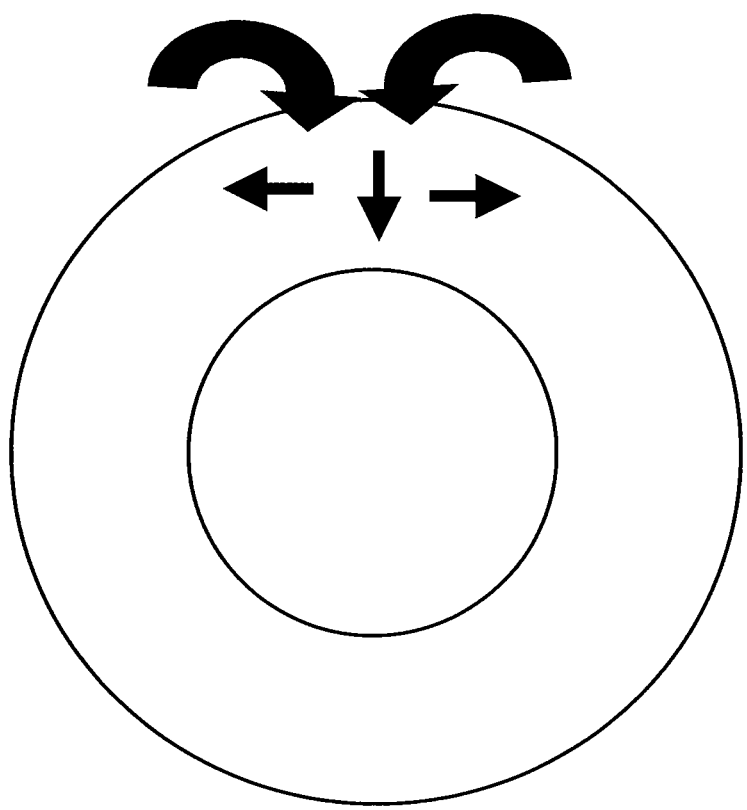
FIG. 4 shows a side view of a cylindrical magnetron sputter target in accordance with the invention.

The magnet structure 20 may be formed of a traditional array of magnets to produce the magnetic field. This will produce a magnetic field that is operable to generate acceptable rates of sputtering. However, only approximately half of the magnetic field produced by the traditional array will be utilized as pass-through flux, passing through the target 10 to form the ion flux required for sputtering. The other half of the magnetic flux only passes through a shunt plate positioned at the bottom of the magnet structure. None of this magnetic flux is utilized for sputtering. As an alternative to a traditional array, a Halbach magnet array may be used for the magnet structure 20. The Halbach magnet array generates a magnetic flux that is enhanced on one side and cancelled on the opposite side. Accordingly, the Halbach array may be positioned as shown in FIG. 4, such that substantially all of the magnetic flux is utilized for sputtering. As a result, the ion flux is denser and more effective sputtering is yielded.

In operation of the invention, an anode and a substrate on which material is sputtered are positioned near the target 10 opposite magnet structure 20. The cylindrical target 10 and the anode are energized with an electric potential. Consequently, electrons are swept around a closed loop corresponding to the closed loop magnetic field established by magnet structure 20. A closed loop glow discharge plasma is formed and material is sputtered from the target onto the substrate. The target 10, and magnet structure 20 are shown from a side view in FIG. 5. The anode, which is not shown, is located above the target 10 during sputtering. In order to promote an even rate of sputtering with respect to the circumference of the target 10, the target is rotated around the magnet structure 20.

As is well known to one of ordinary skill in the art of sputtering, the cathode 10, anode and substrate, and magnet structure 20, are ordinarily confined within a vacuum chamber. Walls 34 of a vacuum chamber are depicted in FIG. 5 beyond the ends of the cylindrical target 10, to represent that the aforementioned apparatus may be within a vacuum chamber 30.

As a result of rotating the target 10 while material is sputtered onto the substrate, much of the target is subjected to the same amount of erosion. Thus, the amount of material yielded from the target is high. However, toward each end of the target, the looped end of the glow discharge plasma may result in a slightly higher erosion rate at a specific location with respect to the axis of the target 10.

In accordance with the invention, trim magnets 40 are placed at each end of the magnet structure 20 in order to alter the shape of the closed-loop of glow discharge plasma adjacent the target 10. By altering the shape of the glow discharge plasma loop, the area of the cathode that experiences the highest amount of erosion may be moved. Using the trim magnets 40 to lengthen the closed loop of glow discharge plasma moves the area of highest erosion toward the ends of the target 10. In contrast, using the trim magnets 40 to shorten the closed-loop of glow discharge plasma moves the area of highest erosion toward the center of the target. Accordingly, the trim magnets may be operated such that the area subject to the highest amount of erosion on the target 10 may be persistently moved so that no one section of the target 10 erodes fastest. The trim magnets may also be used to alter the shape of the glow discharge plasma loop such that buildup of back-scattered material may be removed from the very ends of the target 10, which normally would not be eroded.

The trim magnets 40 may be made of either a permanent magnet or a suitable electromagnet. Either a single magnet may be used, or an array of magnets may be used. The trim magnets 40 may be made of a Halbach array. The trim magnets 40 are placed beyond the ends of the magnet structure 20 such that they alter the magnetic field and the pass-through flux traversing the target 10. In one embodiment, the trim magnets 40 alter the shape of the magnetic field, and the resulting glow discharge plasma, by physically moving. If, for example, the trim magnet 40 is arranged with its polarity opposite to that of the end magnet 26 of the magnet structure 20, the glow discharge plasma loop may be lengthened by moving the trim magnet 40 away from the magnet structure 20, or it may be shortened by moving the trim magnet 40 toward the magnet structure.

If the trim magnet 40 is formed as an electromagnet, an alternative method of altering the shape of the magnetic field is to adjust the strength of the magnets' field by adjusting current. For instance, if the polarity of the trim magnet is such as that shown in FIG. 5, the glow discharge plasma loop may be shortened by increasing the strength of the field, or it may be lengthened by decreasing the strength of the field.

To further increase the amount of influence that the trim magnets 40 have on the glow discharge plasma, their polarity may be reversed during operation of the cylindrical magnetron sputter target. The reversing of polarity may be performed by either physically turning the magnet around, or in the case of an electromagnetic trim magnet 40, it may be performed by reversing the current.

In one advantageous embodiment of the invention, the trim magnets 40 may be placed outside of the vacuum chamber 30 as shown in FIG. 5. This feature is not necessary, but it allows the trim magnets 40 and any components associated with their operation, such as actuators that enable their movement, to be outside of the harsh sputtering environment within the chamber 30.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein. Finally, the entire disclosure of the patents and publications referred in this application are hereby incorporated herein by reference. The implementations described above and other implementations are within the scope of the following claims.

I claim:

1. A cylindrical magnetron sputtering apparatus comprising:
   a rotating cylindrical sputtering target;
   a non-rotating magnet structure extending longitudinally within the rotating cylindrical sputtering target, the magnet structure including a central main magnet having a first polarity operably producing a flux substantially perpendicular to the target, and the magnet structure further including end magnets individually at opposing longitudinal ends of the main magnet and each having a second polarity that is substantially perpendicular to the first polarity; and at least one trim magnet supported end-to-end with the non-rotating magnet structure and longitudinally alignable with the non-rotating magnet structure so that a longitudinal axis of the trim magnet is substantially coextensive with a longitudinal axis of the non-rotating magnet structure, the trim magnet having a third polarity that is substantially opposite the second polarity of the respective adjacent end magnet.

2. The cylindrical magnetron sputtering apparatus of claim 1 wherein the at least one trim magnet is operably stationary.

3. The cylindrical magnetron sputtering apparatus of claim 1 wherein the at least one trim magnet is selectively movable.

4. The cylindrical magnetron sputtering apparatus of claim 1 wherein the at least one trim magnet is positioned outside the rotating cylindrical sputtering target.

5. The cylindrical magnetron sputtering apparatus of claim 1 comprising two trim magnets individually adjacent opposing ends of the non-rotating magnet structure.

6. The cylindrical magnetron sputtering apparatus of claim 1 further comprising a vacuum chamber in which the non-rotating magnet structure and rotating cylindrical sputtering target are positioned, wherein the at least one trim magnet is positioned outside the vacuum chamber.

7. The cylindrical magnetron sputtering apparatus of claim 1 wherein the non-rotating magnet structure includes a Halbach array of magnets.

8. A cylindrical magnetron sputtering apparatus comprising:
   a rotating cylindrical sputtering target;
   a non-rotating magnet structure extending in a longitudinal direction within the cylindrical sputtering target, the magnet structure including a central main magnet having a first polarity and end magnets individually at opposing longitudinal ends of the main magnet each having a second polarity that is substantially perpendicular to the first polarity; and
   at least one trim magnet longitudinally alignable with the non-rotating magnet structure so that a longitudinal axis of the non-rotating magnet structure is substantially coextensive with a longitudinal axis of the trim magnet, the trim magnet having a third polarity that is substantially opposite the second polarity of the respective adjacent end magnet.

9. The cylindrical magnetron sputtering apparatus of claim 8 wherein the trim magnet is characterized by a selectively variable magnetic field strength.

10. The cylindrical magnetron sputtering apparatus of claim 8 wherein the third polarity is selectively reversible.

11. The cylindrical magnetron sputtering apparatus of claim 8 wherein the at least one trim magnet is positioned outside the cylindrical sputtering target.

12. The cylindrical magnetron sputtering apparatus of claim 8 comprising two trim magnets individually adjacent opposing ends of the non-rotating magnet structure.

13. The cylindrical magnetron sputtering apparatus of claim 8 further comprising a vacuum chamber in which the non-rotating magnet structure and the rotating cylindrical sputtering target are positioned, wherein the at least one trim magnet is positioned outside the vacuum chamber.

14. The cylindrical magnetron sputtering apparatus of claim 8 wherein the non-rotating magnet structure includes a Halbach array of magnets.

15. A method of sputtering comprising:
   obtaining a non-rotating magnet structure including a central main magnet having a first polarity and end magnets individually at opposing longitudinal ends of the main magnet each having a second polarity that is substantially perpendicular to the first polarity;
   rotating a cylindrical sputtering target around the non-rotating magnet structure;
   placing a substrate outside the rotating cylindrical sputtering target;
   energizing the rotating cylindrical sputtering target and the substrate with an electrical potential thereby forming a discharge plasma;
   placing a trim magnet in longitudinal alignment with the non-rotating magnet structure so that a longitudinal axis of the trim magnet is substantially coextensive with a longitudinal axis of the non-rotating magnet structure and so that a third polarity of the trim magnet is substantially opposite the second polarity of the respective adjacent end magnet.

16. The method of claim 15 further comprising selectively moving the trim magnet with respect to the non-rotating magnet structure.

17. The method of claim 15 further comprising selectively altering a strength of a magnetic field of the trim magnet.

18. The method of claim 15 further comprising selectively changing the third polarity.

19. The method of claim 15 further comprising placing the rotating cylindrical sputtering target, the non-rotating structure and, and the substrate in a vacuum chamber, wherein the trim magnets are outside the vacuum chamber.

20. The method of claim 15 wherein the obtaining feature is characterized by the non-rotating magnet structure being a Halbach array of magnets.

* * * * *